US011316098B2

(12) United States Patent
Jan et al.

(10) Patent No.: US 11,316,098 B2
(45) Date of Patent: Apr. 26, 2022

(54) HIGH THERMAL STABILITY BY DOPING OF OXIDE CAPPING LAYER FOR SPIN TORQUE TRANSFER (STT) MAGNETIC RANDOM ACCESS MEMORY (MRAM) APPLICATIONS

(71) Applicant: Taiwan Semiconductor Manufacturing Company, Ltd., Hsinchu (TW)

(72) Inventors: Guenole Jan, San Jose, CA (US); Jodi Mari Iwata, San Carlos, CA (US); Ru-Ying Tong, Los Gatos, CA (US); Huanlong Lui, Sunnyvale, CA (US); Yuan-Jen Lee, Fremont, CA (US); Jian Zhu, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 184 days.

(21) Appl. No.: 16/728,049

(22) Filed: Dec. 27, 2019

(65) Prior Publication Data

US 2020/0144486 A1 May 7, 2020

Related U.S. Application Data

(62) Division of application No. 15/728,818, filed on Oct. 10, 2017, now Pat. No. 10,522,744.

(51) Int. Cl.

| | |
|---|---|
| ***H01L 43/08*** | (2006.01) |
| ***H01L 43/12*** | (2006.01) |
| ***H01L 43/10*** | (2006.01) |

(52) U.S. Cl.
CPC .............. *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS 7,596,015 B2 9/2009 Kitagawa et al.
8,921,961 B2 12/2014 Kula et al.
(Continued)

OTHER PUBLICATIONS

Slonczweski, J.C., "Current-driven excitation of magnetic multilayers", Journal of Magnetism and Magnetic Materials, vol. 159, Issues 1-2 Jun. 1996.

*Primary Examiner* — Bo B Jang
(74) *Attorney, Agent, or Firm* — Haynes and Boone, LLP

(57) ABSTRACT

A magnetic tunnel junction (MTJ) is disclosed wherein a free layer (FL) interfaces with a metal oxide (Mox) layer and a tunnel barrier layer to produce interfacial perpendicular magnetic anisotropy (PMA). The Mox layer has a non-stoichiometric oxidation state to minimize parasitic resistance, and comprises a dopant to fill vacant lattice sites thereby blocking oxygen diffusion through the Mox layer to preserve interfacial PMA and high thermal stability at process temperatures up to 400° C. Various methods of forming the doped Mox layer include deposition of the M layer in a reactive environment of $O_2$ and dopant species in gas form, exposing a metal oxide layer to dopant species in gas form, and ion implanting the dopant. In another embodiment, where the dopant is N, a metal nitride layer is formed on a metal oxide layer, and then an anneal step drives nitrogen into vacant sites in the metal oxide lattice.

20 Claims, 5 Drawing Sheets x y z W W 2 2 2 2 20

(56) References Cited

U.S. PATENT DOCUMENTS

| | | | | |
|---|---|---|---|---|
| 8,981,505 | B2 | 3/2015 | Moriyama et al. | |
| 9,006,704 | B2 | 4/2015 | Jan et al. | |
| 9,230,571 | B1 | 1/2016 | Chen et al. | |
| 9,614,258 | B2 | 4/2017 | Takahashi et al. | |
| 2005/0078510 | A1 | 4/2005 | Jeong et al. | |
| 2009/0067232 | A1 | 3/2009 | Korenivski | |
| 2012/0012953 | A1 | 1/2012 | Lottis et al. | |
| 2012/0261776 | A1 | 10/2012 | Tang et al. | |
| 2013/0230741 | A1 | 9/2013 | Wang et al. | |
| 2014/0197504 | A1* | 7/2014 | Moriyama | G11C 11/161 257/421 |
| 2014/0217526 | A1 | 8/2014 | Guo | |
| 2016/0260890 | A1* | 9/2016 | Guo | H01L 43/10 |
| 2016/0315249 | A1 | 10/2016 | Kardasz et al. | |
| 2017/0084836 | A1 | 3/2017 | Kim et al. | |

* cited by examiner

HIGH THERMAL STABILITY BY DOPING OF OXIDE CAPPING LAYER FOR SPIN TORQUE TRANSFER (STT) MAGNETIC RANDOM ACCESS MEMORY (MRAM) APPLICATIONS

PRIORITY DATA

The present application is a divisional application and claims the benefit of U.S. patent application Ser. No. 15/728,818 filed Oct. 20, 2017, herein incorporated by reference in its entirety.

RELATED PATENT APPLICATION

This application is related to the following: Ser. No. 15/841,479, filing date Dec. 14, 2017; which is assigned to a common assignee and herein incorporated by reference in its entirety.

TECHNICAL FIELD

The present disclosure relates to a magnetic tunnel junction (MTJ) comprised of a free layer that interfaces with a tunnel barrier layer and a Hk enhancing layer that is a metal oxide, and in particular to reducing the Hk enhancing layer resistance and minimizing diffusion of oxygen from the metal oxide/free layer interface to provide high perpendicular magnetic anisotropy (PMA) in the free layer that enables thermal stability in the memory device for process temperatures up to 400° C.

BACKGROUND

STT-MRAM technology for writing of memory bits was described by C. Slonczewski in "Current driven excitation of magnetic multilayers", J. Magn. Magn. Mater. V 159, L1-L7 (1996), and is highly competitive with existing semiconductor memory technologies such as SRAM, DRAM, and flash. STT-MRAM has a MTJ cell based on a tunneling magnetoresistance (TMR) effect wherein a MTJ stack of layers has a configuration in which two ferromagnetic layers are separated by a thin insulating tunnel barrier layer. One of the ferromagnetic layers called the pinned layer has a magnetic moment that is fixed in a perpendicular-to-plane direction. The second ferromagnetic layer (free layer) has a 0 magnetization direction that is free to rotate between a direction parallel to that of the pinned layer (P state) and an antiparallel direction (AP state). The difference in resistance between the P state (Rp) and AP state (Rap) is characterized by the equation (Rap−Rp)/Rp that is also known as DRR. It is important for MTJ devices to have a large DRR value, preferably higher than 1, as DRR is directly related to the read margin for the memory bit, or how easy it is to differentiate between the P state and AP state (0 or 1 bits).

State of the art STT-MRAM structures preferably have a free layer with high PMA to allow data retention at small device sizes. For functional MRAM and STT-MRAM products, the free layer (information storage layer) must have a high enough energy barrier ($E_b$) to resist switching due to thermal and magnetic environmental fluctuations. The value $\Delta = kV/k_BT$ is a measure of the thermal stability of the magnetic element where kV is also known as $E_b$ between the two magnetic states (P and AP), $k_B$ is the Boltzmann constant, and T is the temperature. This energy barrier to random switching is related to the strength of the perpendicular magnetic anisotropy (PMA) of the free layer. One practical way to obtain strong PMA is through interfacial PMA at an interface between an iron rich free layer and a MgO tunnel barrier layer. This combination enables good lattice matching as well as the possibility to use MgO as a spin filtering element thereby providing a read signal for the device. Since the writing current density and voltage across the device is significant, this spin filtering element must have high structural quality to sustain billions of write cycles during the lifetime of the memory device.

Recent free layer designs have incorporated a second free layer/metal oxide interface on an opposite side of the free layer with respect to the tunnel barrier to achieve even higher PMA due to an additional interfacial PMA contribution. Therefore, total PMA in the free layer is enhanced with a MgO/CoFeB free layer/MgO stack, for example, that also increases $E_b$ and thermal stability. The spin filtering capability of the second metal oxide layer that is also referred to as a Hk enhancing layer is typically not used. Because the second metal oxide layer contributes to the total resistance of the device without affecting the read signal, it is engineered to have as low resistance as possible.

Equation (1) shows the effect of the second metal oxide (mox) layer resistance contribution to total MTJ resistance while Equation (2) indicates a negative impact (reduction) for DRR.

$$DRR = \frac{R_{AP} - R_P}{R_P} \text{ where} \qquad \text{Eq. (1)}$$

$$R_{AP} = R_{AP}^{barrier} + R_{AP}^{mox} \text{ and}$$

$$R_P = R_P^{barrier} + R_P^{mox}$$

$$\text{Since } R_{AP}^{mox} = R_P^{mox}$$

$$DRR = \frac{R_{AP}^{barrier} + R_{AP}^{mox} - (R_P^{barrier} + R_P^{mox})}{R_P^{barrier} + R_P^{mox}} = \frac{R_{AP}^{barrier} - R_P^{barrier}}{R_P^{barrier} + R_P^{mox}} \qquad \text{Eq. (2)}$$

In summary, the series resistance caused by the second metal oxide layer ($R_{AP}^{mox}$ and $R_p^{mox}$) will cause a reduction in DRR, effectively reducing the STT-MRAM (or MRAM) bit reading margin, as well as increasing the bit's writing voltage by adding a series resistance. Since a MgO Hk enhancing layer or the like is required to achieve strong PMA for enhanced thermal stability, an improved second metal oxide layer structure is needed such that high interfacial PMA is maintained at the free layer interface while significantly reducing the series resistance contribution from the second metal oxide layer.

Generally, low resistance in a Hk enhancing layer is achieved through a lower (non-stoichiometric) oxidation state, or thinning a fully oxidized layer. However, the latter is difficult to accomplish without oxidizing a portion of the free layer. Unfortunately, with regard to a non-stoichiometric oxidation state, oxygen vacancies in the metal oxide layer decrease the thermal stability for the device, and allow for increased mobility of oxygen within the layer, and greater diffusion of metal atoms such as Ta from adjacent layers. Since STT-MRAM devices are likely to be integrated in standard Complementary Metal Oxide Semiconductor (CMOS) processes comprising 400° C. anneal cycles totaling up to 5 hours, this high temperature combined with highly mobile oxygen in a MgO Hk enhancing layer often results in a loss of interfacial PMA at the free layer/Hk enhancing layer interface, and degraded free layer properties. Thus, an improved Hk enhancing layer design must also provide a means of minimizing oxygen diffusion and metal diffusion through the layer in order to preserve high PMA in the free layer and device thermal stability up to 400° C.

SUMMARY

One objective of the present disclosure is to provide a MTJ having a free layer that interfaces with a tunnel barrier layer and a Hk enhancing layer wherein the resistance contribution of the Hk enhancing layer is substantially reduced compared with a fully oxidized layer while interfacial PMA is maintained in the free layer to enable MTJ thermal stability up to 400° C. process temperatures.

A second objective is to provide a Hk enhancing layer according to the first objective that also substantially reduces diffusion of oxygen and other species through the Hk enhancing layer thereby preserving free layer magnetic properties.

A third objective is to provide a method of forming the Hk enhancing layer that satisfies the first two objectives.

According to the present disclosure, there is a plurality of embodiments whereby the aforementioned objectives are achieved. All embodiments relate to a MTJ structure comprising a free layer that is formed between a tunnel barrier layer and a Hk enhancing layer. Furthermore, all embodiments are based on the key feature of incorporating a dopant in the vacant lattice sites within a Hk enhancing layer having a non-stoichiometric oxidation state thereby preventing or substantially reducing the tendency of oxygen and other species to diffuse through the metal oxide lattice structure by a so-called "hopping" mechanism. Thus, the Hk enhancing layer is preferably a metal oxide layer with a substantial number of under oxidized metal atoms such that there are metal (conductive) channels between top and bottom surfaces of the Hk enhancing layer to lower the resistance therein. In other words, the metal oxide lattice has a plurality of non-oxygen containing sites that would be occupied by oxygen anions in a fully oxidized or stoichiometric oxidation state. Instead, the non-oxygen containing sites are occupied with a dopant that is one of N, S, Se, P, C, Te, As, Sb, and Bi. Thus, the dopant will create conducting states in the band gap of a MgO Hk enhancing layer, for example, through hole generation while providing an additional advantage of blocking oxygen diffusion hopping through otherwise vacant sites in under oxidized metal oxide layers found in the prior art.

According to various embodiments of the doped Hk enhancing layer described herein, oxygen in the under oxidized Hk enhancing layer does not diffuse away from the interface with the free layer, and interfacial PMA is maintained. Moreover, species from adjacent layers such as Ta atoms from a cap layer are less likely to diffuse through the Hk enhancing layer and degrade free layer magnetic properties.

According to a first embodiment, the dopant is formed within the Hk enhancing layer during formation of said layer. The metal oxide layer may be formed by first depositing a metal layer such as Mg on the free layer. Then, the metal layer is subjected to a reactive gas environment comprised of flowing oxygen and the dopant in gas form over the metal layer to yield the doped Hk enhancing layer. In other embodiments, a metal oxide such as MgO is sputter deposited from a MgO target in the presence of a dopant in gas form, or a doped MgO target is sputter deposited on the free layer. In an alternative embodiment, a freshly formed MgO layer is prepared by oxidation of a Mg layer or by sputter deposition of MgO, and then the metal oxide is exposed to the dopant in a reactive gas environment. The present disclosure also encompasses a method of forming the doped Hk enhancing layer by implanting the dopant into a metal oxide layer.

According to a second embodiment, the dopant diffuses into the metal oxide Hk enhancing layer during an annealing step subsequent to the Hk enhancing layer deposition. For example, a dopant layer such as MgN or MgON comprised of loosely bound nitrogen may be deposited on a MgO Hk enhancing layer to form a stack of two distinct layers. An anneal step may be performed after the entire MTJ stack of layers is formed such that a certain amount of the loosely bound nitrogen diffuses into the Hk enhancing layer. In another embodiment, the dopant may be implanted into an upper portion of the Hk enhancing layer, and then further distributed through said layer during a subsequent annealing step.

The present disclosure encompasses a MTJ with a bottom spin valve configuration or a top spin valve configuration. In the latter, a seed layer, doped Hk enhancing layer, free layer, tunnel barrier layer, pinned layer, and cap layer are sequentially formed on a substrate that may be a bottom electrode. In the former, a seed layer, pinned layer, tunnel barrier layer, free layer, doped Hk enhancing layer, and cap layer are sequentially formed on the substrate.

DETAILED DESCRIPTION

The present disclosure relates to minimizing the resistance contribution of a Hk enhancing layer, and reducing the diffusion of oxygen and other species through said layer in MTJ cells having a tunnel barrier layer/free layer/Hk enhancing layer configuration thereby enabling a high magnetoresistive ratio and sufficient PMA in the free layer for MTJ thermal stability up to 400° C. The MTJ may be formed in a MRAM, STT-MRAM, magnetic sensor, biosensor, spin torque oscillator, or in other spintronic devices known in the art. Only one MTJ cell is depicted to simplify the drawings, but typically the memory devices described herein contain millions of MTJs that are arrayed in rows and columns on a substrate. The terms "non-stoichiometric" and "under oxidized" are used interchangeably when referring to an oxidation state of a Hk enhancing layer wherein metal atoms in a metal oxide layer are not fully oxidized. An interface that produces interfacial PMA is defined as a boundary region comprised of a free layer surface and an adjoining surface of a metal oxide layer that may be a tunnel barrier layer or Hk enhancing layer. The term "Hk enhancing" refers to a metal oxide layer that increases PMA in the free layer as a result of the metal oxide forming an interface with the free layer.

Figure 1:
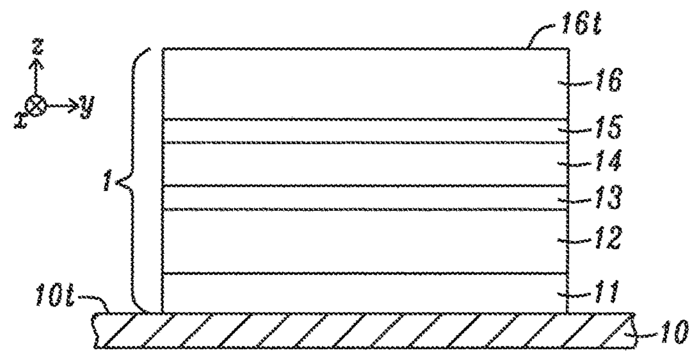
FIG. 1 is a cross-sectional view showing a magnetic tunnel junction (MTJ) wherein a free layer is formed between a tunnel barrier layer and a metal oxide (Hk enhancing) layer according the prior art.

Referring to FIG. 1, the inventors have previously fabricated a MTJ cell 1 with a patterned stack of layers consisting of seed layer 11, pinned layer 12, tunnel barrier 13, free layer 14, Hk enhancing layer 15, and cap layer 16 that are sequentially formed on top surface 10*t* of substrate 10. The substrate may comprise a bottom electrode formed on a substructure comprised of transistors, and a conductive layer with a plurality of bit lines (not shown) that are electrically connected to the bottom electrode layer through vias and the like.

The optional seed layer 11 is comprised of one or more of NiCr, Ta, Ru, Ti, TaN, Cu, Mg, or other materials typically employed to promote a smooth and uniform grain structure in overlying layers.

Pinned layer 12 may have a synthetic anti-parallel (SyAP) configuration represented by AP2/Ru/AP1 where an antiferromagnetic coupling layer made of Ru, Rh, or 1r, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the pinned layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer 13.

Tunnel barrier layer 13 is preferably a metal oxide that is one of MgO, TiOx, AlTiO, MgZnO, $Al_2O_3$, ZnO, ZrOx, HfOx, or MgTaO, or a lamination of one or more of the aforementioned metal oxides. More preferably, MgO is selected as the tunnel barrier layer because it provides the highest magnetoresistive ratio (DRR).

Free layer 14 may be Fe, CoFe, or an alloy thereof with one or both of B and Ni, or a multilayer stack comprising a combination of the aforementioned compositions wherein the Fe content is greater than 50 atomic % (iron rich) of the total content of magnetic elements/constituents. For example, in a $Co_{(loo-x)}Fe_xB$ free layer, x is greater than 50 atomic %. In some embodiments, the free layer has a SyAP configuration such as FL1/Ru/FL2 where FL1 and FL2 are two iron rich magnetic layers that are antiferromagnetically coupled through a Ru layer. In yet another embodiment, the free layer is comprised of a high Ku material having inherent PMA such as a Heusler alloy that is $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, AI, Ga, In, Sn, and Sb. Moreover, the free layer may be an ordered $L1_0$ or $L1_1$ material with a composition that is one of MnAI, MnGa, or an alloy RT wherein R is Rh, Pd, Pt, Ir, or an alloy thereof, and T is Fe, Co, Ni, or alloy thereof, or is a rare earth alloy with a TbFeCo, GdCoFe, FeNdB, or SmCo composition.

Hk enhancing layer 15 is typically a metal oxide layer such as MgO that has a non-stoichiometric oxidation state so that the resistance contribution R** found in the denominator of equation (2) is minimized thereby reducing the adverse effect on DRR. In related patent application HT17-014, we disclosed additional schemes for reducing the resistance contribution from a Hk enhancing layer that generally involve the formation of conductive pathways through the metal oxide layer.

Cap layer 16 is non-magnetic and serves as a hard mask for etch processes that determine the shape of the MTJ cell. The cap layer may be comprised of one or more conductive metals or alloys including but not limited to Ta, Ru, TaN, Ti, TiN, W, and MnPt. Furthermore, the cap layer may comprise an electrically conductive oxide such as RuOx, ReOx, IrOx, MnOx, MoOx, TiOx, or FeOx.

Figure 2:
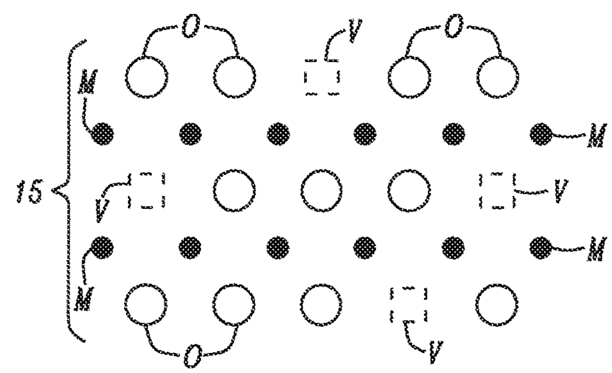
FIG. 2 is an enlarged view of the Hk enhancing layer in FIG. 1 wherein a plurality of lattice sites in the under oxidized metal oxide structure are vacant.

As mentioned earlier, an under oxidized Hk enhancing layer 15 shown in FIG. 2 has vacant sites V in the metal oxide lattice structure that is comprised of metal (M) cations and oxygen (O) anions. In the example, a (001) type plane of MgO in a non-stoichiometric oxidation state is depicted wherein there is a plurality of vacant sites between metal cations. As a result, oxygen is able to diffuse away from the free layer/Hk enhancing layer interface (not shown) through a pathway comprised of a plurality of vacant sites in a so-called "hopping" mechanism. Likewise, species from other layers such as Ta atoms from the cap layer 16 are able to diffuse through the vacant sites into the free layer to cause an undesirable decrease in thermal stability and lower DRR.

Figure 3A:
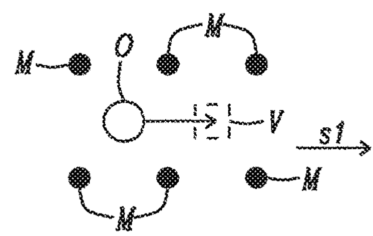
FIGS. 3*a*-3*c* are diagrams showing various steps of a hopping mechanism whereby an oxygen anion diffuses between metal cations to a vacant site in a metal oxide lattice.
Figure 3B:
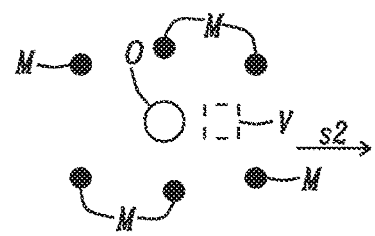
Figure 3C:
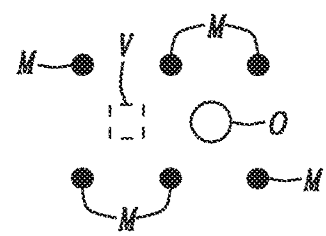

Referring to FIGS. 3*a*-3*c*, the hopping mechanism is illustrated where an oxygen anion O is positioned to the left of a vacant site V in a metal oxide lattice at a starting point in FIG. 3*a*. During step s1, there is sufficient energy provided by one or more sources such as heat during an anneal step to drive diffusion of the larger oxygen anion between two smaller M cations to reach an intermediate (higher energy) state shown in FIG. 3*b*. Note that the relative size of the metal cations and oxygen anions is not necessarily drawn to scale, and the actual space between adjacent rows of metal cations may be less than illustrated. Thereafter, in step s2, the oxygen anion reaches a more favorable energy state at a point shown in FIG. 3*c* by occupying a former vacant site while a new vacant site is formed to the left of the O anion. It should be understood that oxygen anion diffusion between vacant sites may occur in an upward or downward direction (not shown) in addition to a sideways motion through the metal oxide lattice.

Now we have found a Hk enhancing layer design to not only lower the parasitic resistance therein, but also substantially reduce diffusion of oxygen and other species through the metal oxide lattice in an under oxidized Hk enhancing layer. All embodiments described herein involve a MTJ stack of layers wherein a free layer 14 is sandwiched between a tunnel barrier layer 13 and a doped Hk enhancing layer 17 to provide a DRR above 1, and thermal stability up to 400° C. during CMOS processes. The doped Hk enhancing layer contacts the free layer top surface in bottom spin valve configurations, and adjoins the free layer bottom surface in top spin valve configurations as explained in the following embodiments.

Figure 4:
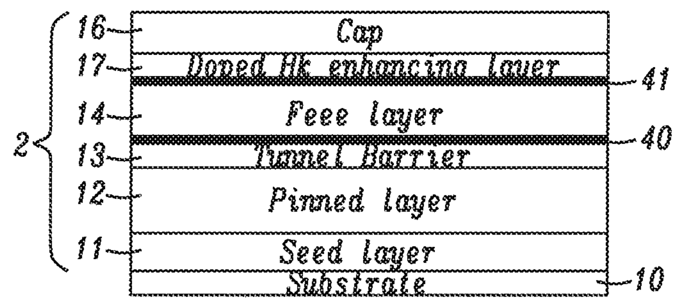
FIG. 4 is a cross-sectional view of a MTJ wherein a free layer is formed between a tunnel barrier layer and an under oxidized metal oxide layer having a plurality of dopant atoms in the metal oxide structure according to an embodiment of the present disclosure.

According to one embodiment of the present disclosure shown in FIG. 4, a MTJ stack of layers 2 having a bottom spin valve configuration retains all of the layers from FIG. 1 except Hk enhancing layer 15 is replaced with doped Hk enhancing layer 17. Thus, PMA in free layer 14 is enhanced through two interfaces with a metal oxide layer including interface 40 with tunnel barrier layer 13, and interface 41 with doped Hk enhancing layer 17.

Figure 5:
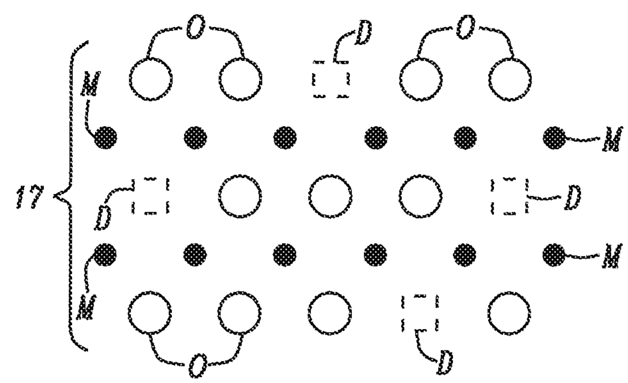
FIG. 5 is an enlarged view of the doped metal oxide layer in FIG. 4 where dopant (D) atoms fill essentially all sites in a metal oxide lattice structure that are not occupied by metal (M) or oxygen (O) atoms.

Referring to FIG. 5, a key feature of all embodiments described herein is to provide an under oxidized Hk enhancing layer 17 that comprises a dopant to fill essentially all lattice sites in a metal oxide (Mox) layer that are not occupied by metal M cations or oxygen O anions. Here, a plurality of dopant anions (D) is provided in lattice sites between metal cations where M is one or more of Mg, Si, Ti, Ba, Ca, La, Mn, V, Al, or Hf. Note that there are substantially more oxygen anions than D anions, which fill the lattice sites between M cations. The present disclosure anticipates the content of dopant in the Hk enhancing layer may be from around 100 ppm up to 20 atomic %. In particular, the dopant may be one or more of N, S, Se, P, and C. However, Te, As, Sb, or Bi may also be selected as a dopant. Dopant anions effectively create conducting states in the band gap of MgO or other metal oxides through hole generation. Moreover, the D anions block diffusion of oxygen through the lattice by filling vacancies that are necessary for oxygen diffusion to occur through a hopping mechanism.

Figure 6:
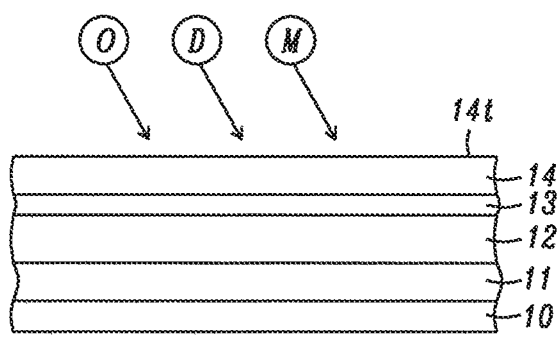
FIG. 6 is a cross-sectional view that depicts a method of forming the doped metal oxide layer in FIG. 4 by simultaneously depositing the dopant species, metal, and oxygen atoms on a top surface of the free layer.

The present disclosure also encompasses a method of incorporating one or more of the aforementioned dopants in the under oxidized Hk enhancing layer 17. According to one embodiment depicted in FIG. 6, the doped metal oxide layer is formed in a reactive gas environment generated by a chemical vapor deposition (CVD), physical vapor deposition (PVD), or a plasma enhanced CVD (PECVD) method wherein dopant species D, metal species M, and oxygen species O are simultaneously deposited on a top surface 14*t* of free layer 14. Oxygen and dopant species may be in gas form when generated with the metal species in a reaction chamber. In one embodiment, the source of the M and O species is a metal oxide (MO) target that is sputtered in the presence of the D species in gas form. In another embodiment, all three species are generated in a reaction chamber by sputtering a MOD target such as MgON, for example. It should be understood that the term "species" may refer to a neutral state such as $O_2$, to an ionic state (cation or anion), or to a radical depending on the temperature and type of power applied to the reaction chamber, and on the source of the dopant species.

Figure 7:
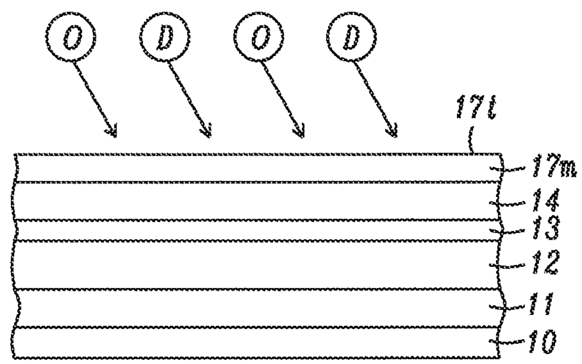
FIG. 7 is a cross-sectional view that depicts a method of forming the doped metal oxide layer in FIG. 4 by exposing a metal layer to a reactive gas environment containing oxygen and a dopant species according to an embodiment of the present disclosure.

In FIG. 7, an alternative embodiment for forming a doped Hk enhancing layer is illustrated. In particular, a metal film 17*m* such as Mg or one of the other M metals or alloys is first deposited on free layer 14. Then, the metal film is exposed to a reactive gas environment containing oxygen species O and dopant species D in gas form. As a result, the O and D species diffuse into the metal film and react with M to yield doped Hk enhancing layer 17 with the lattice structure shown in FIG. 5.

Figure 8:
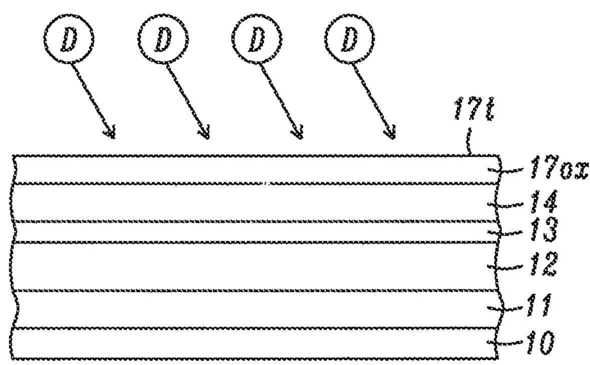
FIG. 8 is a cross-sectional view that depicts a method of forming the doped metal oxide layer in FIG. 4 by exposing a metal oxide layer to a reactive gas environment containing a dopant species according to an embodiment of the present disclosure.

In another embodiment depicted in FIG. 8, an under oxidized Mox layer 17*ox* with exposed top surface 17*t* is formed on the free layer 14. The Mox layer may be formed by sputtering a Mox target, or by first depositing a M layer and then performing a conventional oxidation that may be a natural oxidation (NOX) comprising a flow of $O_2$ over the M layer, or a radical oxidation (ROX) where oxygen radicals react with the M layer. Thereafter, dopant species D are provided in a reactive gas environment that may be a PVD, CVD, or PECVD process, for example. The dopant species diffuse into the Mox layer to form the doped Hk enhancing layer 17 in FIG. 4. Alternatively, dopant species may be implanted in the Mox film shown in FIG. 8 by employing a conventional ion implantation scheme whereby species of a dopant material are accelerated in an ion beam that is directed at top surface 17*t*.

In some embodiments, the dopant has a substantially uniform distribution through Hk enhancing layer 17. However, the present disclosure also anticipates a non-uniform distribution of the dopant in the resulting metal oxide lattice. For example, a higher concentration of dopant may be formed in an upper portion of the Hk enhancing layer while a lower dopant concentration is in a lower portion thereof proximate to the free layer interface.

Figure 9:
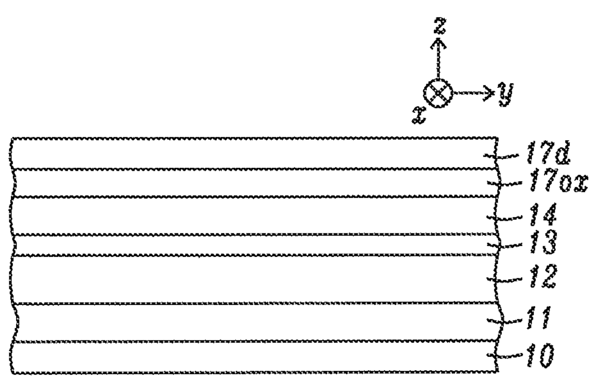
FIG. 9 is a cross-sectional view showing an intermediate MTJ stack of layers comprising a dopant layer on a metal oxide layer that is subsequently converted to a doped metal oxide layer by performing an anneal step.

According to a second embodiment shown in FIG. 9, the dopant is diffused into an under oxidized metal oxide layer with an anneal step after the Mox layer is formed. Moreover, one or more anneal steps may be employed to more evenly distribute a dopant in the Hk enhancing layer 17. The exemplary embodiment comprises depositing a dopant layer 17*d* on the Mox layer 17*ox*. For example, if the dopant is N, then the dopant layer may be a metal nitride or metal oxynitride including but not limited to $Si_3N_4$, MgN, and MgON. Preferably, the metal in the metal nitride or metal oxynitride layer is the same metal as in the underlying Mox layer. It is believed that loosely bound nitrogen in the nitride or oxynitride layer is driven into the underlying Mox layer during one or more anneal steps thereby forming a doped and under oxidized Hk enhancing layer 17 shown in FIG. 4. In some cases, a substantial portion of the loosely bound nitrogen diffuses into the Hk enhancing layer following one or more anneal steps. The anneal steps may include an anneal step (1) after all MTJ layers are formed but before patterning to form a MTJ cell, (2) after MTJ cell formation but before a subsequent encapsulation process, (3) during encapsulation, and (4) after encapsulation layer deposition.

In another embodiment similar to the method shown in FIG. 7, the dopant D may be implanted into an upper portion of the Mox layer 17*ox* to avoid driving the dopant all the way through the Mox layer into the free layer 14. Then, one or more anneal steps are subsequently performed during device fabrication to diffuse the dopant deeper into the Mox layer.

As mentioned previously, the dopant may be unevenly distributed throughout the resulting doped Hk enhancing layer 17 depicted in FIG. 4 such that there is a higher concentration in an upper portion of said layer and a lower concentration or zero concentration of dopant in a lower portion thereof that is proximate to the free layer. Preferably, the concentration of dopant proximate to the interface with the free layer is minimized to prevent diffusion into the free layer where the dopant could alloy with the free layer and lower DRR.

After the doped Hk enhancing layer 17 is formed according to one of the aforementioned embodiments, the cap layer 16 is deposited thereon to complete the MTJ stack of layers shown in FIG. 4.

Figure 10:
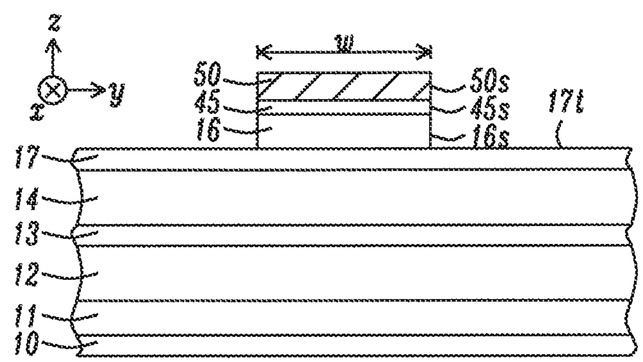
FIG. 10 is a cross-sectional view showing a partially formed MTJ cell having a bottom spin valve configuration shown in FIG. 4 after a photoresist pattern has been etch transferred through an uppermost cap layer.

Referring to FIG. 10, a first sequence of steps is shown for patterning the MTJ stack in FIG. 4. First, a bottom antireflective (BARC) or dielectric antireflective (DARC) layer 45 and a photoresist layer are sequentially formed on cap layer 16. The photoresist layer is patternwise exposed and developed by a conventional photolithography process to form a pattern comprised of a plurality of photoresist islands 50 each having width w and sidewall 50*s*. The photoresist islands are in an array (not shown) and each have a top-down shape that will be essentially duplicated in the underlying MTJ cells to be formed in subsequent steps. A first etch step that may be a reactive ion etch (RIE) based on an oxygen and fluorocarbon etchant, for example, is employed to transfer the photoresist island pattern through the BARC/DARC layer 45 and through cap layer 16 and stopping on top surface 17*t* of the doped Hk enhancing layer. As a result, cap layer sidewall 16*s* is preferably coplanar with photoresist sidewall 50*s* and BARC/DARC sidewall 45*s*.

Figure 11:
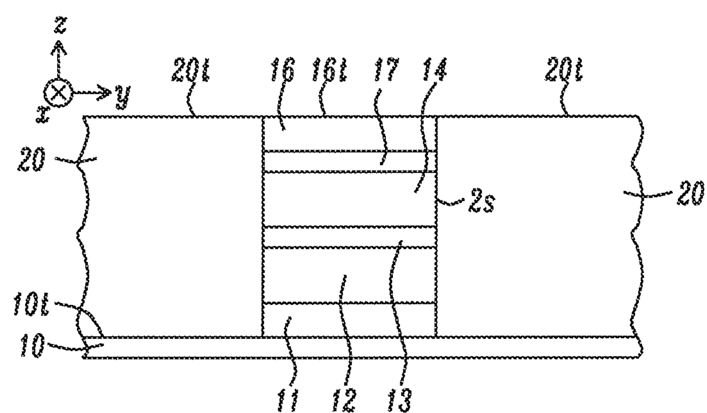
FIG. 11 is a cross-sectional view depicting the MTJ cell in FIG. 10 following a second etch step to complete the MTJ cell, deposition of an encapsulation layer, and a planarization step according to an embodiment described herein.

Referring to FIG. 11, a second RIE or an ion beam etch (IBE) is used to transfer the pattern in the cap layer through underlying layers in the MTJ stack. According to one embodiment, the second RIE or IBE is comprised of plasma or ions of an oxidant such as methanol, and plasma or ions of Ar or another noble gas and generates sidewall 2*s* on MTJ cell 2. However, the present disclosure is not limited to a particular RIE or IBE chemistry and anticipates that other types of etchants may be employed to form sidewall 2*s*.

After, the second RIE or IBE stops on the substrate 10, an encapsulation layer 20 is deposited on substrate top surface 10*t* to fill the gaps between MTJ 2 and adjacent MTJs (not shown). The encapsulation layer is a dielectric material and may include a plurality of sub-layers as appreciated by those skilled in the art. Then, a chemical mechanical polish (CMP) step or another planarization method is performed to form a top surface 20*t* on the encapsulation layer that is coplanar with top surface 16*t* of the cap layer. Any photoresist or BARC/DARC material remaining after the second RIE or IBE step is removed by the CMP step.

Figure 12:
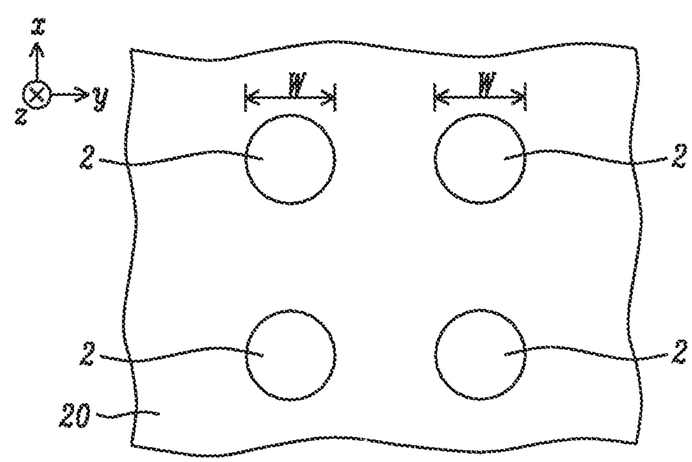
FIG. 12 is a top-down view showing a plurality of MTJ cells formed in rows and columns within in a memory array wherein each MTJ cell is surrounded by an encapsulation layer.

A top-down view of the MTJ structure after the planarization step is shown in FIG. 12. Each MTJ cell 2 is surrounded by encapsulation layer 20, and preferably has a width that is substantially equal to w. In some embodiments, each MTJ has a circular shape where both of the x-axis and y-axis dimensions are equal to w. In other embodiments (not shown), the top-down shape may be elliptical or polygonal such that the x-axis dimension is unequal to the y-axis dimension w.

Figure 13:
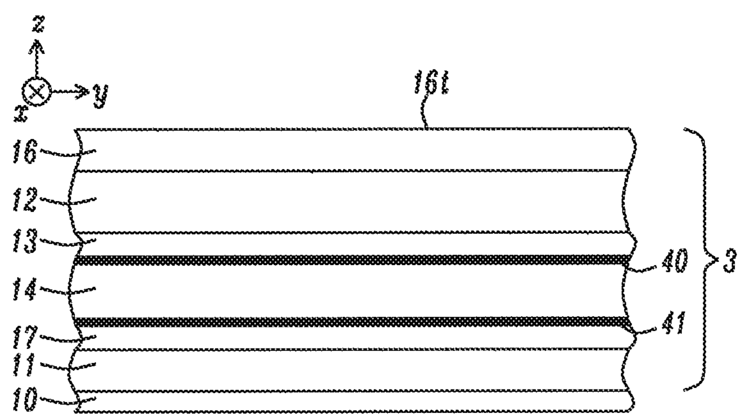
FIG. 13 is a cross-sectional view showing a MTJ stack of layers having a top spin valve configuration wherein a free layer is formed between a tunnel barrier layer and an under oxidized metal oxide layer having a plurality of dopant atoms therein according to another embodiment of the present disclosure.

The present disclosure also encompasses embodiments where the MTJ stack of layers has a top spin valve configuration. According to the embodiment depicted in FIG. 13, a MTJ stack of layers 3 has an optional seed layer 11, the doped Hk enhancing layer 17, free layer 14, tunnel barrier 13, pinned layer 12, and cap layer 16 sequentially formed on substrate 10. The doped Hk enhancing layer is formed according to one of the aforementioned embodiments described with respect to FIGS. 6-9 except for the underlying layer, which is a seed layer, rather than the free layer in previous embodiments. Interface 40 is between the free layer and tunnel barrier layer, and a second interface 41 is between the free layer and Hk enhancing layer.

Figure 14:
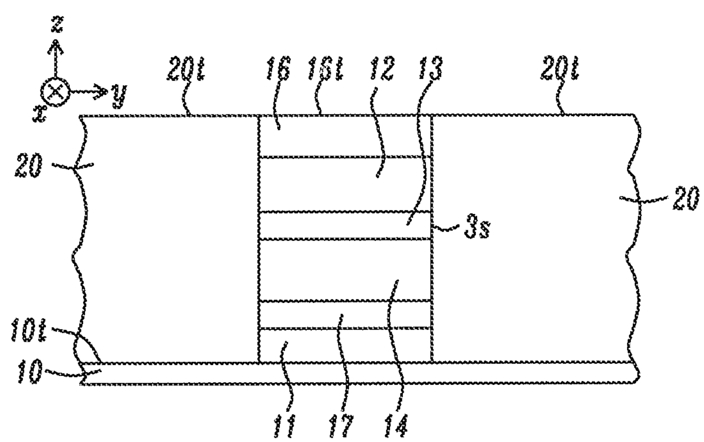
FIG. 14 is a cross-sectional view depicting the MTJ cell formed after patterning the MTJ stack in FIG. 11, depositing an encapsulation layer, and performing a planarization step according to an embodiment of the present disclosure.

Referring to FIG. 14, the MTJ patterning sequence described earlier with respect to FIGS. 10-11 is followed. Thereafter, encapsulation layer 20 is deposited and planarized. Accordingly, sidewall 3*s* is generated on a plurality of MTJ cells each having a surface 16*t* that is coplanar with top surface 20*t* of the encapsulation layer.

Thereafter, a top electrode layer comprised of a plurality of top conductive lines (i.e. source lines) is formed on the MTJ array such that a top conductive line (not shown) contacts a top surface 16*t* of cap layer 16 in each MTJ cell. Thus, there may be a bit line below each MTJ cell and a source line above each MTJ cell to enable read and write currents through the memory device.

All of the embodiments described herein may be incorporated in a manufacturing scheme with standard tools and processes. Moreover, throughput and cost of ownership (COO) remains essentially the same as in conventional memory fabrication schemes.

While the present disclosure has been particularly shown and described with reference to, the preferred embodiment thereof, it will be understood by those skilled in the art that various changes in form and details may be made without departing from the spirit and scope of this disclosure.

What is claimed is:

1. A method comprising:

forming a stack of magnetic tunnel junction (MTJ) layers over a substrate, wherein forming the stack of MTJ layers includes forming a doped metal oxide layer, wherein the doped metal oxide layer includes a dopant species selected from the group consisting of N, S, Se, P, C, Te, As, Sb, or Bi;

patterning the stack of MTJ layers to form a patterned MTJ structure; and encapsulating the patterned MTJ structure, and wherein forming the doped metal oxide layer includes:

forming a metal oxide layer over a substrate; and converting the metal oxide layer into the doped metal oxide layer by incorporating the selected dopant.

2. The method of claim 1, wherein the doped metal oxide layer includes a metal species (M), an oxygen species (O) and the dopant species (D), and wherein forming the metal oxide layer includes sputter depositing a target comprised of M and O to form the metal oxide layer; and wherein converting the metal oxide layer into the doped metal oxide layer by incorporating the selected dopant includes exposing the metal oxide layer to the selected dopant in gas form.

3. The method of claim 1, wherein the doped metal oxide layer includes a metal species (M), an oxygen species (O) and the dopant species (D), and wherein forming the metal oxide layer includes:

depositing a layer that includes M; and exposing the layer to a reactive gas environment containing O.

4. The method of claim 1, wherein the doped metal oxide layer includes a metal species (M), an oxygen species (O) and the dopant species (D), and wherein forming the metal oxide layer includes:

depositing a layer that includes M;

oxidizing the layer with O to form the metal oxide layer; and wherein converting the metal oxide layer into the doped metal oxide layer by incorporating the selected dopant includes exposing the metal oxide layer to a reactive gas environment containing the selected D in gas form.

5. The method of claim 1, wherein converting the metal oxide layer into the doped metal oxide layer by incorporating the selected dopant includes implanting the selected dopant species into the metal oxide layer to form the doped metal oxide layer.

6. The method of claim 1, wherein converting the metal oxide layer into the doped metal oxide layer by incorporating the selected dopant includes:

forming a doped layer that includes the selected dopant over the metal oxide layer; and performing an annealing process on the doped layer to drive the selected dopant into the metal oxide layer to thereby form the doped metal oxide layer.

7. The method of claim 1, wherein the doped metal oxide layer is a doped Hk enhancing layer.

8. The method of claim 1, further comprising forming a seed layer, and wherein forming the doped metal oxide layer includes forming the doped metal oxide layer directly on the seed layer.

9. A method comprising:

forming a free layer over a substrate;

forming a metal oxide layer over the free layer;

converting the metal oxide layer into a doped metal oxide layer by incorporating a dopant selected from the group consisting of N, S, Se, P, C, Te, As, Sb, or Bi;

forming a cap layer over the doped metal oxide layer.

10. The method of claim 9, wherein forming the metal oxide layer includes sputter depositing a target comprised of a metal species and oxygen to form the metal oxide layer, and wherein converting the metal oxide layer into the doped metal oxide layer includes exposing the metal oxide layer to the selected dopant in gas form.

11. The method of claim 9, wherein forming the metal oxide layer includes depositing a metal containing layer and oxidizing the metal containing layer to form the metal oxide layer, and wherein converting the metal oxide layer into the doped metal oxide layer includes exposing the metal oxide layer to a reactive gas environment containing the selected dopant in gas form.

12. The method of claim 9, wherein converting the metal oxide layer into the doped metal oxide layer includes implanting the selected dopant into the metal oxide layer to form the doped metal oxide layer.

13. The method of claim 9, herein converting the metal oxide layer into the doped metal oxide layer includes:

forming a doped layer that includes the selected dopant over the metal oxide layer; and performing an annealing process on the doped layer to drive the selected dopant from the doped layer into the metal oxide layer to thereby form the doped metal oxide layer.

14. The method of claim 9, wherein the doped metal oxide layer has a lower portion that is proximate the free layer and an upper portion that is disposed over the lower portion, wherein a concentration of the selected dopant in the upper portion of the doped metal oxide layer is greater than a concentration of the selected dopant in the lower portion of the doped metal oxide layer, wherein the dopant is present in the lower portion and the upper portion of the doped metal oxide layer.

15. The method of claim 9, further comprising:

patterning the cap layer, the doped metal oxide layer and the free layer to form a patterned magnetic tunnel junction (MTJ) structure; and encapsulating the patterned MTJ structure.

16. A method comprising:

forming a first layer over a substrate;

forming a metal layer over the first layer;

converting the metal layer into a doped metal oxide layer, the doped metal oxide layer including a dopant selected from the group consisting of N, S, Se, P, C, Te, As, Sb, or Bi;

forming a second layer over the doped metal oxide layer.

17. The method of claim 16, wherein converting the metal layer into the doped metal oxide layer incudes exposing the metal layer to a reactive gas environment that includes oxygen and the selected dopant in gas form.

18. The method of claim 16, wherein converting the metal layer into the doped metal oxide layer incudes:

performing an oxidation process on the metal layer to form a metal oxide layer; and exposing the metal oxide layer to a reactive gas environment that includes the selected dopant in gas form.

19. The method of claim 16, wherein converting the metal layer into the doped metal oxide layer incudes:

performing an oxidation process on the metal layer to form a metal oxide layer; and forming a doped layer on the metal oxide layer, the doped layer including the selected dopant;

patterning the first layer, the metal oxide layer and the second layer to form a patterned magnetic tunnel junction (MTJ) structure; and performing an annealing process to drive the selected dopant from the doped layer into the metal oxide layer to thereby form the doped metal oxide layer after patterning the first layer, the metal oxide layer and the second layer to form the patterned magnetic tunnel junction (MTJ) structure.

20. The method of claim 16, wherein the first layer is a seed layer and the second layer is a free layer.

* * * * *